United States Patent [19]

Kondoh et al.

[11] 4,264,710
[45] Apr. 28, 1981

[54] PHOTOPOLYMERIZABLE COMPOSITIONS CONTAINING INHIBITOR COMPOUNDS HAVING THIOUREYLENE GROUPS

[75] Inventors: Syunichi Kondoh; Takeshi Takayama, both of Asaka; Akira Umehara, Minamin-ashigara; Tadao Shishido, Minami-ashigara; Isamu Itoh, Minamin-ashigara, all of Japan

[73] Assignee: Fuji Photo Film Co., Ltd., Minami-ashigara, Japan

[21] Appl. No.: 136,642

[22] Filed: Apr. 2, 1980

[30] Foreign Application Priority Data

Apr. 3, 1979 [JP] Japan ................. 54/39925

[51] Int. Cl.³ ............................ G03C 1/68
[52] U.S. Cl. ..................... 430/281; 430/282; 430/285; 430/288; 430/917; 204/159.18; 204/159.24
[58] Field of Search ............... 430/281, 282, 283, 285, 430/286, 287, 288, 917; 204/159.15, 159.16, 159.18, 159.24

[56] References Cited

U.S. PATENT DOCUMENTS

| 3,864,133 | 2/1975 | Higamatsu et al. ............ 430/917 |
| 4,050,942 | 9/1977 | Nacci ............................. 430/917 |

*Primary Examiner*—Jack P. Brammer
*Attorney, Agent, or Firm*—Sughrue, Rothwell, Mion, Zinn and Macpeak

[57] ABSTRACT

A photopolymerizable composition is described comprising (1) an addition-polymerizable compound having at least one ethylenically unsaturated double bond, (2) a photopolymerization initiator, and (3) a post-exposure polymerization inhibitor compound including a thioureylene group, such as a compound selected from the group consisting of thiourea and thiourea derivatives represented by the general formula (I), thiosemicarbazide and thiosemicarbazide derivatives represented by the general formula (II), and thiosemicarbazone derivatives represented by the general formula (III):

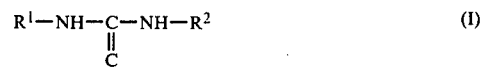

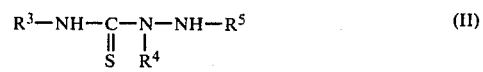

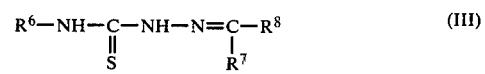

wherein:

$R^1$ and $R^2$, which may be the same or different each represents a hydrogen atom, an alkyl group having from 1 to 6 carbon atoms, a substituted alkyl group having from 1 to 6 carbon atoms, a phenyl group, a naphthyl group, a substituted phenyl group or a monovalent group derived from an O-, S- or N-containing 5- or 6-member heterocyclic nucleus, $R^3$ represents a hydrogen atom, an alkyl group having from 1 to 6 carbon atoms, a substituted alkyl group having from 1 to 6 carbon atoms, a phenyl group, a naphgroup or a substituted phenyl group, $R^4$ represents a hydrogen atom or an alkyl group having from 1 to 6 carbon atoms, $R^5$ represents a hydrogen atom, an alkyl group having from 1 to 6 carbon atoms, a phenyl group, a naphthyl group, a monovalent group derived from an 0-, N- or S-containing 5- or 6-member heterocyclic nucleus, an alkylcarbonyl group having from 2 to 7 carbon atoms or a benzoyl group, $R^6$ represents a hydrogen atom, an alkyl group having from 1 to 6 carbon atoms, a phenyl group or a naphthyl group, $R^7$ represents a hydrogen atom or an alkyl group having from 1 to 6 carbon atoms, and $R^8$ represents an alkyl group having from 1 to 6 carbon atoms, a phenyl group, a naphthyl group or a substituted phenyl group.

26 Claims, No Drawings

PHOTOPOLYMERIZABLE COMPOSITIONS CONTAINING INHIBITOR COMPOUNDS HAVING THIOUREYLENE GROUPS

BACKGROUND OF THE INVENTION

1. Field of the Invention

The present invention relates to photopolymerizable compositions, and particularly, to photopolymerizable compositions containing a post-exposure polymerization inhibitor.

2. Description of the Prior Art

It is known that images can be formed by a process which comprises: (1) producing a photosensitive material having a layer including a photopolymerizable composition (the sensitive layer) by applying a solution of a photopolymerizable composition comprising an addition-polymerizable compound having at least one ethylenically unsaturated double bond (the ethylenic compound), a photopolymerization initiator and, if desired, a film forming high molecular weight substance (the binder), a thermal polymerization inhibitor, a plasticizer, etc., to a first base; (2) imagewise exposing the sensitive layer to light with using a desired original, to thereby harden the exposed parts of the sensitive layer by polymerization; and (3) removing the unexposed unhardened parts of the sensitive layer by dissolution. This process is referred to as solvent development. An alternative process comprises: (1) bonding the sensitive layer of the photosensitive material as described above to an image-receiving base (with either the first base of the photosensitive material or the image-receiving base being transparent) to produce a laminate; (2) imagewise exposing the laminate to light through the transparent base to polymerize the exposed part of the sensitive layer, as a result of which the relative adhesive strength of the sensitive material to the first base and that to the image-receiving base varies between the exposed part and the unexposed part, such that upon separating the bases from each other by stripping the unexposed part of the sensitive layer adheres to the opposite base (to the base adhered to by the exposed layer) to form an image of the sensitive layer. This process is referred to as stripping development.

In these processes, there is no problem in case of forming images by solvent development or stripping development if the development is conducted shortly after imagewise exposure. However, if the development is carried out after a substantial lapse of time from the time of the exposure, radicals formed by the exposure remain even after the exposure, and therefore the polymerization reaction continues even after the exposure. Consequently, a phenomenon akin to excessive exposure occurs, causing faults upon image formation, such as collapse of letters, formation of thick lines, etc.

As a method of overcoming such a phenomenon, it has been proposed to add thermal polymerization inhibitors in order to capture the radicals. However, known thermal polymerization inhibitors such as phenols, aromatic amines, copper stearate, copper naphthol, mercaptan, dialkyl sulfides, phenothiazine, alkyl triphenyl phosphates or alkyl xanthates, etc., generally causes a large desensitization of the photopolymerized material exposed to light. Further, they are not effective for preventing post-exposure polymerization.

SUMMARY OF THE INVENTION

As a result of studies conducted on about various thermal polymerization inhibitors, compounds have now been found which cause less desensitization upon imagewise exposure and are effective for preventing post-polymerization.

An object of the present invention is to provide photopolymerizable compositions in which continuation of the polymerization reaction during a lapse of time after exposure (post-exposure polymerization) caused by residual radicals which are formed during exposure is prevented.

Another object of the present invention is to provide photopolymerizable compositions in which post-exposure polymerization is prevented while maintaining a high sensitivity to exposure.

A further object of the present invention is to stabilize polymerized latent images in the exposed parts of photosensitive materials having a photopolymerizable composition layer as a sensitive layer, by preventing the continuation of the polymerization reaction during a lapse of time after exposure caused by residual radicals which are formed by imagewise exposure.

A still further object of the present invention is to stabilize polymerized latent images in the exposed parts of photosensitive materials having a photopolymerizable composition layer as a sensitive layer in which post-exposure polymerization is prevented while maintaining a high sensitivity to exposure.

Furthermore, another object of the present invention is to provide photosensitive materials having a photopolymerizable composition layer as a sensitive layer, in which an apparent excessive exposure state is prevented by preventing the post-polymerization in case of carrying out the development after the lapse of time from imagewise exposure.

The present invention relates to a photopolymerizable composition comprising: (1) an addition-polymerizable compound having at least one ethylenically unsaturated double bond and (2) a photopolymerization initiator and (3) a post-exposure polymerization inhibitor compound including a thioureylene group

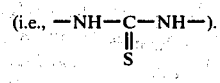

Preferably, the compound containing the thioureylene group is selected from the group consisting of thiourea and thiourea derivatives represented by the general formula (I), thiosemicarbazide or thiosemicarbazide derivatives represented by the general formula (II), or thiosemicarbazone derivatives represented by the general formula (III):

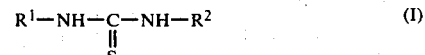
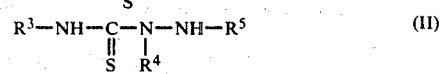
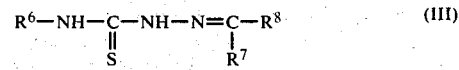

In the general formula (I), $R^1$ and $R^2$ each represents a hydrogen atom, an alkyl group having 1 to 6 carbon atoms, a substituted alkyl group having 1 to 6 carbon atoms, a phenyl group, a naphthyl group, a substituted phenyl group or a monovalent group derived from an O-, S- or N-containing 5- or 6-member heterocyclic nucleus. $R^1$ and $R^2$ may be identical or different from each other.

In the general formula (II), $R^3$ represents a hydrogen atom, an alkyl group having 1 to 6 carbon atoms, a substituted alkyl group having 1 to 6 carbon atoms, a phenyl group, a substituted phenyl group or a naphthyl group, $R^4$ represents a hydrogen atom or an alkyl group having 1 to 6 carbon atoms, and $R^5$ represents a hydrogen atoms, an alkyl group having 1 to 6 carbon atoms, a phenyl group, a naphthyl group, a monovalent group derived from an O-, N- or S-containing 5- or 6-member heterocyclic nucleus, an alkylcarbonyl group having 2 to 7 carbon atoms or a benzoyl group.

In the general formula (III), $R^6$ represents a hydrogen atom, an alkyl group having 1 to 6 carbon atoms, a phenyl group or a naphthyl group, $R^7$ represents a hydrogen atom or an alkyl group having 1 to 6 carbon atoms, and $R^8$ represents an alkyl group having 1 to 6 carbon atoms, a phenyl group, a naphthyl group or a substituted phenyl group.

The photopolymerizable compositions described above may further contain a binder comprising a high molecular weight organic substance having film-forming capability.

DETAILED DESCRIPTION OF THE INVENTION

The reference to an addition-polymerizable compound having at least one ethylenically unsaturated double bond (also sometimes referred to herein as the ethylenic compound) refers to addition-polymerizable compounds having one or more ethylenically unsaturated double bonds in the molecule, which includes not only mono-, di- and trifunctional monomers having 1, 2 or 3 ethylenically unsaturated double bonds, but also polyfunctional oligomers having a molecular weight of 10,000 or less. It also refers to mixtures of such compounds and prepolymers in which some of the ethylenic bonds are in a copolymerized state.

In the present invention preferred ethylenic compounds have 2 or more ethylenic double bonds in the molecule, in which at least one, and preferably almost all, of the ethylenic double bonds are in a conjugated position with respect to carbon atoms linked to a hetero atom such as oxygen, nitrogen or sulfur, etc., by a double bond. Preferred ethylenic compounds are those in which the ethylenic double bond is conjugated with respect to the carbonyl group in an ester or amide bond. Examples of these ethylenic compounds include esters of unsaturated carboxylic acid and aliphatic polyols and oligoester (or polyester) unsaturated carboxylates in which unsaturated carboxylic acid is linked to a oligoester (or polyester) of a polybasic carboxylic acid and an aliphatic polyol by an ester bond.

Examples of the unsaturated carboxylic acids include acrylic acid, methacrylic acid, itaconic acid, crotonic acid, isocrotonic acid and maleic acid.

Examples of the aliphatic polyol include ethylene glycol, diethylene glycol, triethylene glycol, tetraethylene glycol, tetramethylene glycol, neopentyl glycol, 1,10-decanediol, trimethylolethane, trimethylolpropane, 1,2-butanediol, 1,3-butanediol, propylene glycol, glycerine, diglycerine, pentaerythritol, dipentaerythritol, tripentaerythritol and other polypentaerythritols, sorbitol, d-mannitol and dihydroxymaleic acid.

The esters of aliphatic polyol and unsaturated carboxylic acid include, for example, acrylic acid esters and methacrylic acid esters. Specific examples include ethylene glycol diacrylate, diethylene glycol dimethacrylate, polyethylene glycol diacrylate, pentaerythritol diacrylate, pentaerythritol and triacrylate, pentaerythritol dimethacrylate, pentaerythritol trimethacrylate, dipentaerythritol pentaacrylate, glycerine triacrylate, glycerine trimethacrylate, diglycerine dimethacrylate, 1,3-propanediol diacrylate, trimethylolpropane triacrylate and trimethylolpropane trimethacrylate.

Examples of the oligoester unsaturated carboxylates which can be suitably used as the ethylenic compound in the present invention are oligoester acrylates and methacrylates. The terms oligoester acrylates and methacrylates refer to reaction products obtained by esterification reactions of acrylic acid or methacrylic acid with a polybasic acid or polyhydric alcohol, which are compounds having the general structural formula represented by general formula (IV):

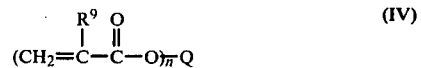

$$(CH_2{=}C{-}C{-}O)_{\overline{n}}Q \quad (IV)$$
(with $R^9$ above the central C and $O$ as the carbonyl)

wherein $R^9$ represents a hydrogen atom or a methyl group, Q represents an ester residue having at least one ester bond formed from polyhydric alcohol and polybasic acid, and n is an integer of from 1 to 6, and preferably from 2 to 6.

Examples of polyhydric alcohols that can form the ester residue Q include ethylene glycol, 1,2-propylene glycol, 1,4-butanediol, 1,6-hexanediol, trimethylolpropane, trimethylolethane, 1,2,6-hexanetriol, glycerine, pentaerythritol or sorbitol, and polyether type polyhydric alcohols such as diethylene glycol, triethylene glycol, tetraethylene glycol, polyethylene glycol, dipropylene glycol, tripropylene glycol or polypropylene glycol.

Examples of the polybasic acid that can form the ester residue Q include phthalic acid, isophthalic acid, terephthalic acid, tetrachlorophthalic acid, tetrabromophthalic acid, trimellitic acid, pyromellitic acid or benzophenonedicarboxylic acid, unsaturated aliphatic polybasic acids such as maleic acid, fumaric acid, 5-norbornene-2,3-dicarboxylic acid or itaconic acid, etc., and saturated aliphatic polybasic acids such as malonic acid, succinic acid, glutaric acid, adipic acid, pimelic acid, sebacic acid, dodecanoic acid, tetrahydrophthalic acid or 2,3-norbornanedicarboxylic acid, etc.

The ester residue Q includes those which are formed from only one kind of each the above-described polyhydric alcohols and polybasic acids and those which are composed of two or more kinds of either one, or both, of the polyhydric alcohols and polybasic acids. Further, the ester residue Q includes those which are composed of one molecule of the polyhydric alcohol and one molecule of the polybasic acid and those which are composed of two or more molecules of either one or both of them. Namely, any compound may be used if at least one ester bond is contained in the residue Q. Furthermore, the ester residue Q includes those which contain a hydroxyl group, those which contain hydroxyl groups esterified with monobasic carboxylic acid and those which are substituted by alkoxy groups such as methoxy or ethoxy group, etc. Furthermore, carboxylic acid groups may be contained in the residue Q. When synthesizing the oligoester acrylate or methacrylate, the number of n and the number of ester bonds in the residue Q according to the general formula (IV) can be controlled by selecting the kind and the amount of acrylic acid or methacrylic acid and the polyhydric alcohol or polybasic acid. The value of n is usually selected to be in the range of from 1 to 6 in order to prevent gelation in the synthesis process. When n is 2 or more, the oligoester acrylate or methacrylate may contain either acryloyl groups or methacryloyl groups in the molecule or may contain both acryloyl groups and methacryloyl groups in a suitable ratio in the same molecule. The oligoester acrylate or methacrylate to be used can be selected according to sensitivity required for the photoresist material of the present invention or properties of the film formed by photopolymerization.

General structural formulae of the oligoester acrylates and methacrylates are shown in Table 1. Other examples of the oligoesters include unsaturated esters as described in Japanese patent application (OPI) No. 9676/72 (the term "OPI" as used herein refers to a "published unexamined Japanese patent application") corresponding to U.S. Pat. No. 3,732,107. In Table 1, Y in the structural formulae represents an acryloyl group

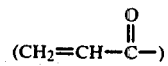

or a methacryloyl group

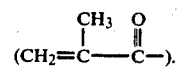

TABLE 1

Examples of Oligoester Acrylate (Methacrylate)

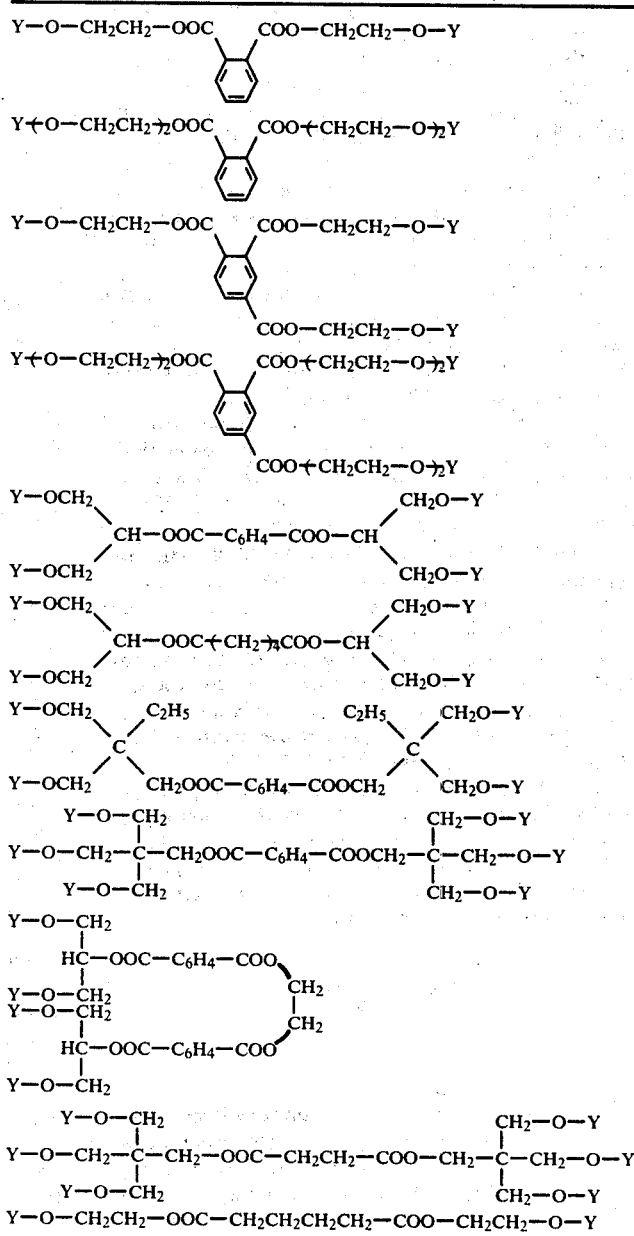

TABLE 1-continued

Examples of Oligoester Acrylate (Methacrylate)

Y—O—CH$_2$CH$_2$—OOC⟨benzene⟩COO—CH$_2$CH$_2$—O—Y

Y(―O—CH$_2$CH$_2$―)$_2$OOC—CH$_2$CH$_2$CH$_2$—COO—CH$_2$
Y(―O—CH$_2$CH$_2$―)$_2$OOC—CH$_2$CH$_2$CH$_2$—COO—CH
Y(―O—CH$_2$CH$_2$―)$_2$OOC—CH$_2$CH$_2$CH$_2$—COO—CH$_2$

Combinations of two or more of the ethylenic compounds may be used.

In embodiments of the invention containing as a binder a high molecular weight organic substance having film-forming capability, these ethylenic compounds are used in the range of from about 10 to 500 parts by weight, and preferably from 3 to 200 parts by weight, based on 100 parts by weight of the binder.

With respect to the photopolymerization initiator used in the present invention, known photopolymerization initiators can be used. For example, it is possible to use carbonyl compounds, organic sulfur compounds, peroxides, redox compounds, azo and diazo compounds, halogen compounds and photo-reducing dyes, as described in *Light-Sensitive Systems* by J. Kosar, Chapter 5 (published by John Wiley & Sons, Inc., 1965, New York), combinations of cyclic cis-α-dicarbonyl compounds and bis(p-aminophenyl-α,β-unsaturated)-ketones, bis(alkylamino)acridine dyes, cyanine dyes containing two heterocyclic rings linked by a single methine group, styryl dye bases, 7-di-lower alkylamino-4-lower alkyl coumarins, p-aminophenylketones, p-dialkylaminophenyl unsaturated compounds or 6-dialkylaminoquinaldines as described in Japanese patent application (OPI) No. 84183/73, corresponding to U.S. Pat. No. Re. 28,789, combinations of hexaarylbiimidazoles and bis(p-aminophenyl-α,β-unsaturated)-ketones as described in Japanese patent application (OPI) No. 2528/72, corresponding to U.S. Pat. No. 3,652,275, and combinations of compounds having at least one oxo-oxygen atom linked to an aromatic ring or compounds having at least one oxo-oxygen atom linked to a carbon atom which is linked to a carbon atom on an aromatic ring and compounds having a p-dialkylaminocinnamoyl group, 2-(p-dialkylaminobenzylidene)cycloalkanones, p-dialkylaminochalcones, chalcone derivatives or p-dialkylaminostyryl styryl ketones as described in Japanese patent application (OPI) No. 90387/78.

Examples of carbonyl compounds useful as photopolymerization initiators include benzoin, benzoin methyl ether, benzophenone, anthraquinone, 2-methylanthraquinone, 2-t-butylanthraquinone, 9,10-phenanthrenequinone, diacetyl, benzyl and compounds represented by the general formula (V):

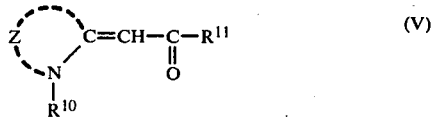

(V)

wherein $R^{10}$ represents an alkyl group substituent of the type known in common cyanine dyes (for example, an unsubstituted lower alkyl group, such as a methyl group, an ethyl group, a propyl group, a butyl group, an isopropyl group, etc.), a hydroxyalkyl group, an alkoxyalkyl group, a carboxyalkyl group, a sulfoalkyl group or an aralkyl group; $R^{11}$ represents an alkyl group (e.g., a lower alkyl group such as a methyl group, an ethyl group, a propyl group, a butyl group or an isopropyl group, is preferred), an aryl group (e.g., a phenyl group, a p-hydroxyphenyl group, a p-methoxyphenyl group, a p-chlorophenyl group or a naphthyl group is preferred) or a thienyl group; and Z represents a nonmetallic group necessary to form a nitrogen-containing heterocyclic ring of the type known in common cyanine dyes, such as a benzothiazoline ring, a naphthothiazoline ring, a benzoselenazoline ring, a naphthoselenazoline ring, a benzoxazoline ring or a naphthoxazoline ring.

Examples of the compounds represented by the general formula (V) include 2-benzoylmethylene-3-methyl-β-naphthothiazoline, 2-benzoylmethylene-3-ethyl-β-naphthothiazoline, 3-ethyl-2-(2-thenoyl)methylene-β-naphthothiazoline, 3-ethyl-2-propionylmethylene-β-naphthothiazoline and 5-chloro-3-ethyl-2-p-methoxybenzoylmethylene-benzothiazoline.

Examples of the organic sulfur compounds include dibutyldisulfide, dioctyldisulfide, dibenzyldisulfide, diphenyldisulfide, dibenzoyldisulfide and diacetyldisulfide.

Examples of the peroxides include hydrogen peroxide, di-t-butylperoxide, benzoyl peroxide and methyl ethyl ketone peroxide.

The redox compounds are composed of a combination of a peroxide and a reducing agent, examples of which include a combination of ferrous ion and hydrogen peroxide, a combination of ferrous ion and persulfate ion, and a combination of ferric ion and peroxides.

Examples of the azo and diazo compounds include α,α'-azobisisobutyronitrile, 2-azobis-2-methylbutyronitrile, 1-azobiscyclohexanecarbonitrile and p-aminodiphenylamine diazonium salt, etc.

Examples of the halogen compounds include chloromethylnaphthyl chloride, phenancyl chloride, chloroacetone, β-naphthalenesulfonyl chloride and xylenesulfonyl chloride.

Examples of the photo-reducing dyes include Rose Bengal, Erythrocin, Eosine, acryflavin, riboflavin and Thionine.

The above-described photopolymerization initiators can be used alone except for the redox compounds. Among these photopolymerization initiators, preferred initiators include anthraquinone derivatives such as 2-methylanthraquinone, 2-ethylanthraquinone, 2-isopropylanthraquinone or 2-t-butylanthraquinone, benzoin derivatives such as 9,10-phenanthrenequinone or benzoin methyl ether, and naphthothiazoline derivatives such as 2-benzoylmethylene-3-methyl-β-naphthothiazoline, 2-benzoylmethylene-3-ethyl-β-naphthothiazoline, 3-ethyl-2-(2-thenoyl)methylene-β-naphthothiazoline or 3-ethyl-2-propionylmethylene-β-naphthothiazoline.

Examples of the cyclic cis-α-dicarbonyl compounds include 2,3-bornanedione, 2,2,5,5-tetramethyltetrahydro-3,4-furanedione, parabanic acid (imidazoletrione), indole-2,3-dione, 1,1,4,4-tetramethyltetraline-2,3-dione, 3-methyl-1,2-cyclopentanedione, 2,3-dioxo-5,6-diethoxy-5,6-dicyanopyrazine, and 1,4,5,6-tetrahydro-5,6-dioxo-2,3-pyrazinedicarboxylic acid.

Examples of the bis(p-aminophenyl-α,β-unsaturated)-ketones include 2,6-bis[(p-dimethylamino)benzylidene]cyclohexanone, 2,5-bis[(p-dimethylamino)benzylidene]cyclopentanone, 2,5-bis[(p-diethylamino)benzylidene]cyclopentanone, 2,6-bis(4-diethylamino-2-methylbenzylidene)cyclohexanone, 2,5-bis(4-diethylamino-2-methylbenzylidene)cyclopentanone, 2,5-bis[(p-dimethylamino)cinnamylidene]cyclopentanone and 1,3-bis[(p-dimethylamino)benzylidene]actone. Bis(alkylamino)acridine dyes are described in U.S. Pat. No. 3,563,751, column 3, lines 21–69, examples of which include 3,6-bis(dimethylamino)acridine hydrochloride (Acridine Orange, C.I. #46005B), 3,6-bis(dimethylamino)-10-methylacridinium methanesulfonate (C.I. #46010), 2,7-dibromo-3,6-bis(dimethylamino)acridine hydrochloride (C.I. #46015), 3,6-bis(dimethylamino)-9-phenylacridine hydrochloride (C.I. #46055), 3,6-bis(diethylamino)acridine hydrochloride (Diethyl Orange), 3,6-bis(dibutylamino)acridine hydrochloride, 3,6-bis(dimethylamino)-9-butylacridine hydrochloride, 3,6-bis(dimethylamino)-10-butylacridine hydrochloride, 2,7-dichloro-3,6-bis(diethylamino)acridine hydrochloride, 2,7-diethyl-3,6-bis(diethylamino) acridine hydrochloride and 2,7-dimethyl-3,6-bis-(diethylamino)acridine hydrochloride. Cyanine dyes containing two heterocyclic rings linked by a single methine group are described, for example, in U.S. Pat. No. 3,099,558, column 3, lines 17–33, examples of which include 5-chloro-1',3-diethyl-6'-methylthia-2'-cyanine iodide, 3,3'-diethylthiacyanine p-toluenesulfonate, 3,3'-diethyloxazolocyanine iodide, 3,3'-dimethylthiazolinocyanine iodide, 1,3'-diethylthia-2'-cyanine iodide and 1',2-diethyloxa-2'-cyanine iodide.

Styryl dye bases are described, for example, in U.S. Pat. No. 3,099,558, column 6, line 61 to column 7, line 9, examples of which include 1-ethyl-2,4-di[(p-dimethylamino)styryl]pyridinium chloride, 2,4-di{4-[(p-dimethylamino)phenyl]-1,3-butadienyl}-1-ethylpyridinium iodide and 2-(p-dimethylamino)styrylbenzothiazole.

7-Di-lower alkylamino-4-lower alkyl-coumarins are described, for example, in U.S. Pat. No. 3,583,797, column 3, line 71 to column 4, line 4, examples of which include 7-dimethylamino-4-methylcoumarin and 7-diethylamino-4-methylcoumarin.

p-Aminophenylketones are described, for example, in U.S. Pat. No. 3,552,973, column 3, line 40 to column 4, line 10, examples of which include p-aminobenzophenone, p-(butylamino)benzophenone, p-(dimethylamino)acetophenone, p-(dimethylamino)propiophenone, p-(diethylamino)butyrophenone, p-(dibutylamino)acetophenone, p-(dimethylamino)-benzophenone, p-(dimethylamino)phenyl p-tolyl ketone, p-(diethylamino)benzophenone, p,p'-bis(ethylamino)-benzophenone, p,p'-bis(dimethylamino)benzophenone, p,p'-bis(diethylamino)-benzophenone and p,p'-(dibutylamino)benzophenone. Examples of the p-dialkylaminophenyl unsaturated compounds include p-(dimethylamino)benzoin, p-(dimethylamino)benzaldehyde and p-(dimethylamino)benzonitrile. Examples of 6-dialkylaminoquinaldines (i.e., 6-dialkylamino-2-methylquinolines) include 6-(dimethylamino)quinaldine and 6(diethylamino)-quinaldine.

In the combinations of the cyclic cis-α-dicarbonyl compounds and the bis(p-aminophenyl-α,β-unsaturated)ketones, bis(alylamino)acridine dyes, cyanine dyes, styryl dye bases, 7-lower dialkylamino-4-lower alkylcoumarins, p-aminophenylketones, p-dialkylaminophenyl unsaturated compounds or 6-dialkylaminoquinaldines, the ratio by weight of cyclic cis-α-dicarbonyl compound to the other compound or compounds is in the range from about 15:1 to about 1:5, and preferably from about 10:1 to about 1:2.

Examples of hexaarylbiimidazoles include 2,2',4,4',5,5'-hexaphenylbiimidazoles (2,4,5-triphenylimidazolyl dimer), specific examples of which include 2,2'-bis(o-chlorophenyl)-4,4',5,5'-tetraphenylbiimidazole, 2,2'-bis(o-chlorophenyl)-4,4',5,5'-tetrakis(m-methoxyphenyl)-biimidazole, 2,2'-bis(p-carboxyphenyl)-4,4',5,5'-tetraphenylbiimidazole, 2,2'-bis(p-chlorophenyl)-4,4',5,5'-tetrakis(p-methoxyphenyl)-biimidazole, 2,2'-di-o-tolyl-4,4',5,5'-tetraphenylbiimidazole and 2,2'-di-p-tolyl-4,4'-di-o-tolyl-5,5'-diphenylbiimidazole. Examples of the bis-(p-aminophenyl-α,β-unsaturated)ketones useful in combination with hexaarylbiimidazoles include those previously described above. The ratio of ketone:hexaarylbiimidazole can range from about 0.001 mole to 1 mol:1 mol, and preferably is about 0.01 mol to 0.5 mol:1 mol.

Further, the compounds having at least one oxo-oxygen atom linked to the aromatic ring include polynuclear condensed aromatic ketones having a cyclopentadienone structure or cyclohexadienone structure and polynuclear condensed quinones. The compounds having at least one oxo-oxygen atom linked to a carbon atom which links to a carbon atom on the aromatic ring include aromatic acyloins, aromatic acyloin ethers and aromatic ketones. Examples of the aromatic acyloins include benzoin, o-toluoin, p-toluoin and furoin. Examples of the aromatic acyloin ethers include benzoin methyl ether, benzoin ethyl ether, benzoin isopropyl ether, benzoin sec-butyl ether, o-toluoin methyl ether and p-toluoin methyl ether. Examples of the aromatic ketones include benzophenone, phenyl tolyl ketone, 2-chlorobenzophenone, 2-chloroacetophenone, acetophenone, propiophenone, benzyl, 2,2'-dimethylbenzyl and phenyl β-naphthyl ketone. Examples of the polynuclear condensed aromatic ketones having a cyclopentadienone structure or cyclohexadienone structure include fluorenone, anthrone, benzanthrone and 10,10'-bianthrone. Examples of the polynuclear condensed quinones include anthraquinone, 1-hydroxyanthraquinone, 1-methylanthraquinone, 2-methylanthraquinone, 2-ethylanthraquinone, 1-chloroanthraquinone, 1-bromoanthraquinone, 2-chloroanthraquinone, phenanthraquinone, 1-methylphenanthraquinone, 4-ethylphenanthraquinone, 2-chlorophenanthraquinone, 3-bromophenanthraquinone, 2,7-dimethylphenanthraquinone, 2,7-di-tert-butyl-phenanthraquinone and 1,2-benzanthraquinone.

Examples of the compounds having a p-dialkylaminocinnamoyl group include p-dimethylaminostyryl methyl ketone, p-dimethylaminostyryl ethyl ketone, p-dimethylaminostyryl propyl ketone, p-dimethylaminostyryl butyl ketone, p-dimethylaminostyryl isobutyl ketone, p-dimethylaminostyryl tert-butyl ketone, p-dimethylaminostyryl cyclohexyl ketone, p-dimethylaminostyryl benzyl ketone, p-dimethylaminostyryl phenethyl ketone, p-dimethylaminocinnamic acid methyl ester, p-dimethylaminocinnamic acid ethyl ester, p-dimethylaminostyryl 2-pyridyl ketone, p-dimethylaminostyryl 4-pyridyl ketone, p-dimethylaminostyryl 2-thienyl ketone and p-dimethylamino 9-anthryl ketone.

Examples of the 2-(p-dialkylaminobenzylidene)-cycloalkanones include 2-(p-dimethylaminobenzylidene)-cyclohexanone and 2-(p-dimethylaminobenzylidene)cyclopentanone.

Examples of the p-dialkylaminochalcones include p-dimethylaminochalcone, p-dimethylamino-m'-chlorochalcone, p-dimethylamino-p'-chlorochalcone, p-dimethylamino-m'-bromochalcone, p-dimethylamino-p'-bromochalcone, p-dimethylamino-p'-cyanochalcone, p-dimethylamino-p'-methoxychalcone, p-dimethylamino-p'-methylchalcone, p-dimethylamino-m'-methylchalcone, p-dimethylamino-p'-ethylchalcone, p-dimethylamino-m'-ethylchalcone, p-diethylamino-p'-bromochalcone, p-diethylamino-m'-bromochalcone, p-diethylamino-p'-chlorochalcone and p-diethylamino-m'-chlorochalcone.

Examples of the chalcone derivatives include p'-dimethylaminochalcone, p-cyano-p'-dimethylaminochalcone, m-chloro-p'-dimethylaminochalcone, p-chloro-p'-dimethylaminochalcone, m-bromo-p'-dimethylaminochalcone, p-bromo-p'-dimethylaminochalcone, m-methyl-p'-dimethylaminochalcone, p-methyl-p'-dimethylaminochalcone, m-ethyl-p'-dimethylaminochalcone, p-ethyl-p'-dimethylaminochalcone, p-methoxy-p'-dimethylaminochalcone and p,p'-bix(dimethylamino)chalcone.

Examples of the p-dialkylaminostyryl styryl ketones include p-dimethylaminostyryl p-methylstyryl ketone, p-dimethylaminostyryl p-ethylstyryl ketone, p-dimethylaminostyryl p-chlorostyryl ketone, p-dimethylaminostyryl m-chlorostyryl ketone, p-dimethylaminostyryl p-bromostyryl ketone, p-dimethylaminostyryl m-bromostyryl ketone, p-dimethylaminostyryl p-methoxystyryl ketone, p-dimethylaminostyryl p-ethoxystyryl ketone, p-dimethylaminostyryl p-cyanostyryl ketone, p-dimethylaminostyryl m-methylstyryl ketone, p-dimethylaminostyryl m-ethylstyryl ketone, bis(p-dimethylaminostyryl)ketone and bis(p-diethylaminostyryl)ketone.

When using the photopolymerization initiator comprising a combination of compounds having at least one oxo-oxygen atom linked to an aromatic ring or compounds having at least one oxo-oxygen atom linked to the carbon atom which is linked to a carbon atom on an aromatic ring (component (a)) and the compounds having a p-dialkylaminocinnamoyl group, 2-(p-dialkylaminobenzylidene)cycloalkanones, p-dialkylaminochalcones, chalcone derivatives or p-dialkylaminostyryl styryl ketones (component (b)), the ratio by weight of (a):(b) is in the range from about 30:1 to about 1:30, and preferably is from 10:1 to 1:10.

The foregoing photopolymerization initiators are used in the amounts ranging from about 0.1 to 20 parts by weight, and preferably from 1 to 10 parts by weight, based on 100 parts by weight of the ethylenic compound.

In the following discussion, post-exposure polymerization inhibitors useful in the present invention are illustrated. The post-exposure polymerization inhibitor is a compound which prevents post-exposure polymerization by capturing residual radicals after exposure, but the inhibitor sould not capture the radicals necessary to initiate the initial polymerization (i.e., the polymerization caused by imagewise application of light for hardening).

The thiourea or thiourea derivatives represented by the general formula (I), thiosemicarbazide or thiosemicarbazide derivatives represented by the general formula (II) and thiosemicarbazone derivatives represented by the general formula (III) (included herein as thioureylene compound, because they have the structure

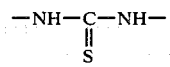

(thioureylene group)) are compounds which have been used as vulcanization accelerators for rubber and are described in *Yuki Gosei Kagaku*, Vol. 36 (No. 5) pages 395 to 402 (1978). In the photopolymerizable compositions of the present invention, the thioureylene compound is included therein as a post-exposure polymerization inhibitor.

First, the general formulae (I) to (III) are illustrated. When $R^1$, $R^2$, $R^3$, $R^4$, $R^5$, $R^6$, $R^7$ or $R^8$ represents an alkyl group having from 1 to 6 carbon atoms, the alkyl group can be a straight, branched or cyclic alkyl group, examples of which include a methyl group, an ethyl group, a propyl group, a butyl group, a pentyl group, a hexyl group, an isopropyl group, an isobutyl group, an isopentyl group, an isohexyl group, a sec-butyl group, a cyclopentyl group or a cyclohexyl group. The methyl group, ethyl group, propyl group or cyclohexyl group is preferred.

When $R^1$, $R^2$ or $R^3$ represents a substituted alkyl group having from 1 to 6 carbon atoms, the substituent of the substituted alkyl group may be a hydroxyl group, a halogen atom (fluorine atom, chlorine atom, bromine atom or iodine atom), an amino group, or a phenyl group. Examples of such substituted alkyl groups include a hydroxymethyl group, a 2-hydroxyethyl group, a 3-hydroxypropyl group, a 6-hydroxyhexyl group, a 2-hydroxypropyl group, a 2-hydroxybutyl group, a benzyl group and a phenethyl group. The hydroxymethyl group, the 2-hydroxyethyl group or the benzyl group is preferred.

When $R^1$, $R^2$, $R^3$ or $R^8$ represents a substituted phenyl group, the substituent can be an alkyl group, an alkoxy group, an amino group, an alkylamino group, a dialkylamino group, a cyano group, a nitro group, a hydroxyl group and a halogen atom. Examples of the alkyl group include a methyl group and an ethyl group. Examples of the alkoxy group includes a methoxy group and an ethoxy group. Examples of the alkylamino group include a methylamino group and an ethylamino group. Examples of the dialkylamino group include a dimethylamino group, a diethylamino group and a methylethylamino group. Examples of the halogen include a fluorine atom, a chlorine atom, a bromine atom and an iodine atom. The methyl group, methoxy group, amino group, dimethylamino group, cyano group, nitro group, hydroxyl group, chlorine atom or bromine atom is preferred. Examples of such substituted phenyl groups include a p-tolyl group, an m-tolyl group, an o-tolyl group, a p-ethylphenyl group, a p-methoxyphenyl group, an m-methoxyphenyl group, a p-ethoxyphenyl group, a p-aminophenyl group, an m-aminophenyl group, a p-(methylamino)phenyl group, a p-(ethylamino)phenyl group, a p-(dimethylamino)phenyl group, a p-(methylethylamino)phenyl group, a p-(diethylamino)phenyl group, a p-cyanophenyl group, a p-nitrophenyl group, an m-nitrophenyl group, an o-nitrophenyl group, a p-hydroxyphenyl group, an m-hydroxyphenyl group, an o-hydroxyphenyl group, a p-fluorophenyl group, a p-chlorophenyl group, an m-chlorophenyl group, an o-chlorophenyl group, a p-bromophenyl group, an m-bromophenyl group and a p-iodophenyl group. Preferred substituted phenyl groups are the p-tolyl group, p-methoxyphenyl group, p-aminophenyl group, p-(dimethylamino)phenyl group, p-cyanophenyl group, p-nitrophenyl group, m-nitrophenyl group, o-nitrophenyl group, p-hydroxyphenyl group, m-hydroxyphenyl group, o-hydroxyphenyl group, p-chlorophenyl group, m-chlorophenyl group or the p-bromophenyl group.

When $R^1$, $R^2$, $R^3$, $R^5$, $R^6$ or $R^8$ represents a naphthyl group, the naphthyl group can be a 1-naphthyl group or a 2-naphthyl group.

When $R^1$, $R^2$ or $R^5$ represents a monovalent group derived from an O-, S- or N-containing 5- or 6-member heterocyclic nucleus, the heterocyclic nucleus may be furan, thiophene, 1,3-thiazole (hereinafter referred to as thiazole), piperidine, pyridine or pyrimidine. Examples of the monovalent group derived from these heterocyclic nuclei include a 2-furyl group, a 2-thenyl group, a 1,3-thiazol-2-yl group (hereinafter referred to as the 2-thiazolyl group), a piperidino group, a 2-pyridyl group and a 2-pyrimidyl group. The 2-furyl group, 2-thenyl group, 2-thiazolyl group, 2-pyridyl group or 2-pyrimidinyl group is preferred. These monovalent groups may have an alkyl group substituent, a preferred example of which is a 4-methyl-2-pyrimidinyl group.

When $R^5$ represents an alkylcarbonyl group having from 2 to 7 carbon atoms, the carbon atom number includes the carbon atom of the carbonyl group. Accordingly, the alkyl part has 1 to 6 carbon atoms. The alkyl part may be a straight, branched or cyclic alkyl group having from 1 to 6 carbon atoms. Examples of the alkylcarbonyl group include an acetyl group, a propionyl group, a butyryl group, a valeryl group, a hexanoyl group, an isobutyryl group, an isovaleryl group, a pivaloyl group and a cyclohexylcarbonyl group. The acetyl group or propionyl group is preferred.

Examples of the thiourea and thiourea derivatives represented by the general formula (I) include the following compounds:

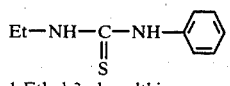
1-Ethyl-3-phenylthiourea (I-1)

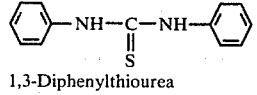
1,3-Diphenylthiourea (I-2)

Et—NH—C(=S)—NH—Et (I-3)
1,3-Diethylthiourea

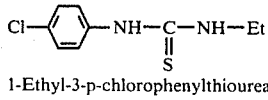
1-Ethyl-3-p-chlorophenylthiourea (I-4)

1-Ethyl-3-(2-hydroxyethyl)thiourea (I-5)

1-(2-Thiazolyl)-3-phenylthiourea (I-6)

Et—NH—C(=S)—NH$_2$ (I-7)
1-Ethylthiourea

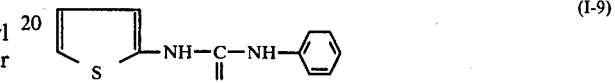
1-p-Bromophenyl-3-phenylthiourea (I-8)

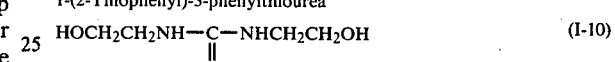
1-(2-Thiophenyl)-3-phenylthiourea (I-9)

HOCH$_2$CH$_2$NH—C(=S)—NHCH$_2$CH$_2$OH (I-10)
1,3-Bis(2-hydroxyethyl)thiourea

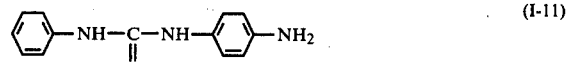
1-p-Aminophenyl-3-phenylthiourea (I-11)

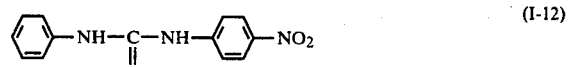
1-p-Nitrophenyl-3-phenylthiourea (I-12)

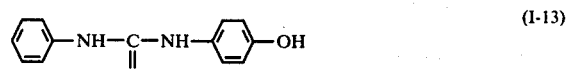
1-p-Hydroxyphenyl-3-phenylthiourea (I-13)

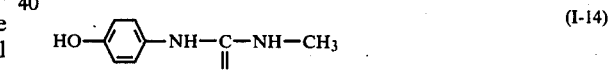
1-Methyl-3-p-hydroxyphenylthiourea (I-14)

1-Phenylthiourea (I-15)

1-m-Nitrophenylthiourea (I-16)

1-p-Nitrophenylthiourea (I-17)

1-p-Aminophenylthiourea (I-18)

H$_2$N—C(=S)—NH$_2$ (I-19)
Thiourea

H$_3$C—NH—C(=S)—NH—CH$_3$ (I-20)
1,3-Dimethylthiourea

| | |
|---|---|
| (I-21) 1,3-Dicyclohexylthiourea: C₆H₁₁-NH-C(=S)-NH-C₆H₁₁ | |
| (I-22) 1-Phenyl-3-p-chlorophenylthiourea: Ph-NH-C(=S)-NH-C₆H₄-Cl | |
| (I-23) 1-Phenyl-3-p-methoxyphenylthiourea: Ph-NH-C(=S)-NH-C₆H₄-OCH₃ | |
| (I-24) 1,1-Diphenylthiourea: (Ph)₂N-C(=S)-NH₂ | |
| (I-25) 1,1-Dibenzyl-3-phenethylthiourea: (Ph-CH₂)₂N-C(=S)-NH-CH₂-CH₂-Ph | |
| (I-26) 1-Phenyl-3-(2-hydroxyethyl)thiourea: Ph-NH-C(=S)-NH-CH₂CH₂OH | |

Examples of thiosemicarbazide and thiosemicarbazide derivatives represented by the general formula (II) include the following compounds:

(II-1) 1-Acetylthiosemicarbazide: $H_2N-C(=S)-NHNH-C(=O)-CH_3$ (II-2) 2-Methyl-4-phenylthiosemicarbazide: Ph-NH-C(=S)-N(CH₃)-NH₂

(II-3) 1-Methyl-1,4-diphenylthiosemicarbazide: Ph-NH-C(=S)-NH-N(CH₃)-Ph (II-4) 1-(2-Pyridyl)-4-ethylthiosemicarbazide: Et-NH-C(=S)-NH-NH-(2-pyridyl)

(II-5) 1,4-Diphenylthiosemicarbazide: Ph-NH-C(=S)-NH-NH-Ph (II-6) 1-(2-Pyridyl)-4-phenylthiosemicarbazide: Ph-NH-C(=S)-NH-NH-(2-pyridyl)

(II-7) 1-(2-pyridyl)-4-p-chlorophenylthiosemicarbazide: Cl-C₆H₄-NH-C(=S)-NH-NH-(2-pyridyl)

(II-8) 1-(2-Thienyl)-4-ethylthiosemicarbazide: Et-NH-C(=S)-NH-NH-(2-thienyl)

(II-9) 4-Methylthiosemicarbazide: $CH_3NH-C(=S)-NHNH_2$ (II-10) Thiosemicarbazide: $NH_2-C(=S)-NHNH_2$ (II-11) 4-(2-Hydroxyethyl)thiosemicarbazide: $HOCH_2CH_2-NH-C(=S)-NHNH_2$ (II-12) 1-(2-Thienyl)-4-phenylthiosemicarbazide: Ph-NH-C(=S)-NHNH-(2-thienyl)

(II-13) 1-p-Nitrophenyl-4-phenylthiosemicarbazide: Ph-NH-C(=S)-NHNH-C₆H₄-NO₂

(II-14) 1-m-Nitrophenyl-4-phenylthiosemicarbazide: Ph-NH-C(=S)-NHNH-C₆H₄(NO₂)

(II-15) 1-p-Hydroxyphenyl-4-phenylthiosemicarbazide: Ph-NH-C(=S)-NHNH-C₆H₄-OH (II-16) 1-Phenyl-4-p-hydroxyphenylthiosemicarbazide: HO-C₆H₄-NH-C(=S)-NHNH-Ph (II-17) 1-p-Aminophenyl-4-phenylthiosemicarbazide: Ph-NH-C(=S)-NH-NH-C₆H₄-NH₂

(II-18) 1-Benzoylthiosemicarbazide: $H_2N-C(=S)-NH-NH-C(=O)-Ph$ (II-19) 1-Acetyl-4-methylthiosemicarbazide: $H_3C-NH-C(=S)-NH-NH-C(=O)-CH_3$ (II-20) 1-(4-Methyl-2-pyrimidinyl)-4-ethylthiosemicarbazide: Et-NH-C(=S)-NH-NH-(4-methyl-2-pyrimidinyl)

Examples of thiosemicarbazone derivatives represented by the general formula (III) include the following compounds:

(III-1) 1-Phenyl-5-p-(dimethylamino)phenylthiosemicarbazone: Ph-NH-C(=S)-NHN=CH-C₆H₄-NMe₂

(III-2) 1-Phenyl-5-p-methoxyphenylthiosemicarbazone: Ph-NH-C(=S)-NHN=CH-C₆H₄-OCH₃

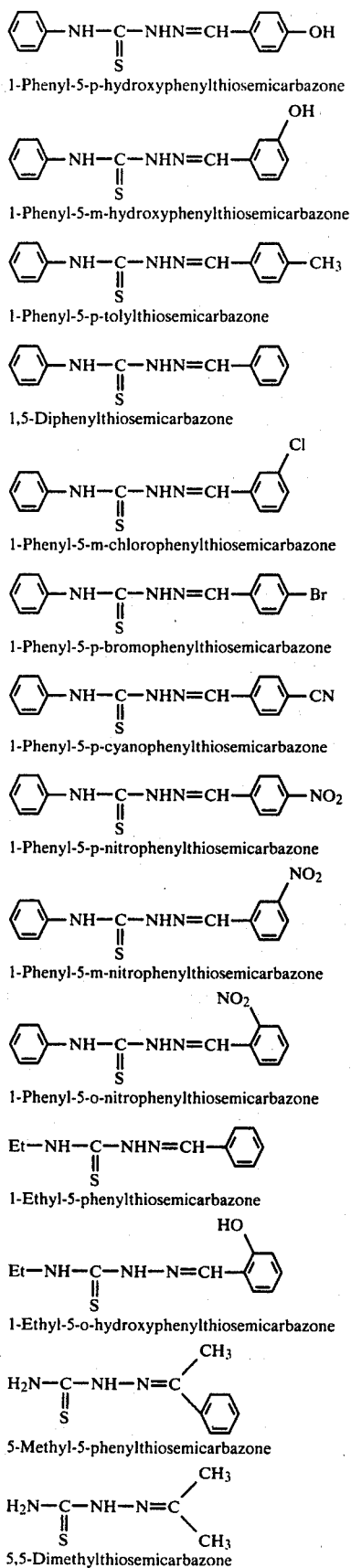
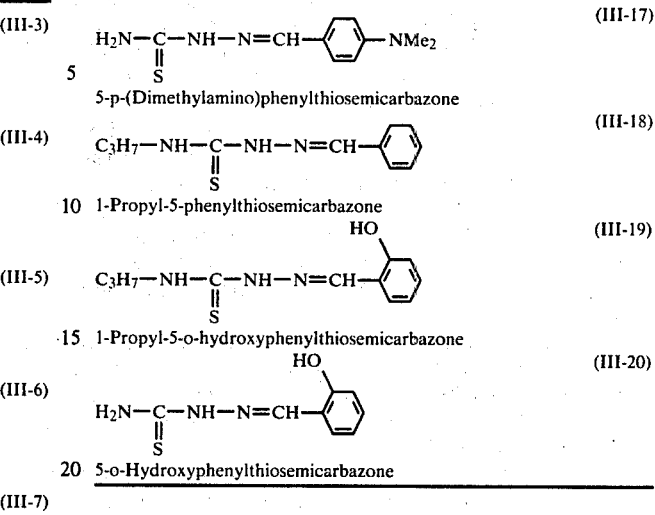

The post-exposure polymerization inhibitor can be included in the composition in an amount in the range of from about 0.001% to 10% by weight, and preferably from 0.01% to 3% by weight, based on the weight of the ethylenic compound.

Examples of the high molecular weight organic substances having a film-forming capability that can be used as the binder in the present invention include chlorinated polyolefins (for example, chlorinated polyethylene and chlorinated polypropylene), polymethyl methacrylate, polymethyl acrylate, polyvinyl chloride, polyvinylidene chloride, polyvinyl butyral, polyvinyl acetate, vinyl chloride-vinyl acetate copolymer, vinylidene chlorideacrylonitrile copolymer, polyisoprene, chlorinated rubber, polychloroprene, chlorosulfonated polyethylene and chlorosulfonated polypropylene. The preferred film-forming high molecular weight substances are chlorinated polyethylene, chlorinated polypropylene, polymethyl methacrylate and mixtures thereof. The binder is used for the purpose of controlling the viscosity of the photopolymerizable composition of the present invention before polymerization (i.e., to increase the viscosity) or controlling the film strength before polymerization or after polymerization (i.e., to increase the film strength in both cases). Though the binder is not an indispensable component in the photopolymerizable compositions, it is often preferred to use it.

The photopolymerizable compositions of the present invention may contain various additives such as coloring agents, plasticizers, etc. Pigments such as carbon black, phthalocyanine pigments or azo pigments, etc., and dyes such as Methylene Blue, Crystal Violet, Rhodamine B, Fuchsine, Auramine, azo dyes, or anthraquinone dyes, etc., can be used as coloring agents. It is preferred to use coloring agents which do not absorb light at the same absorption wavelengths as the photopolymerization initiator. The coloring agents can be included in an amount in the range of from about 0.1 to 30 parts by weight for pigments or from about 0.01 to 10 parts by weight for dyes, based on 100 parts by weight of the total weight of the ethylenic compound and the binder. It is preferred that the pigment or dye be included in an amount in the range of from 0.1 to 3 parts by weight.

Useful plasticizers include phthalic acid esters such as dimethyl phthalate, diethyl phthalate, dibutyl phthalate, diisobutyl phthalate or dioctyl phthalate, etc., glycol esters such as dimethylglycol phthalate, ethylphthalyl ethylglycolate, methylphthalyl ethylglycolate, butylphthalyl butylglycolate or triethyleneglycol dicaprylate, etc., phosphoric acid esters such as tricresyl phosphate or triphenyl phosphate, etc., triethyl citrate, glycerine triacetic acid ester and butyl laurate. The plasticizers can be used in an amount in the range of from about 2 to about 50 parts by weight, and preferably from about 5 to about 30 parts by weight, based on 100 parts by weight of the total amount of the ethylenic compound and the binder.

In photopolymerizable compositions according to the present invention, the total amount of the components other than the ethylenic compound and the binder can be equal to or less than the total amount of the ethylenic compound and the binder.

The photopolymerizable compositions of the present invention can be prepared by mixing the components to produce a homogeneous mixture. When the ethylenic compound is a liquid and has the capability of dissolving large amounts of other components, the homogeneous mixture can be formed without using a solvent. However, in many cases the homogeneous mixture is obtained using a solvent which dissolves the components, and this latter method is usually preferred. Examples of the useful solvents include ketones such as acetone, methyl ethyl ketone, methyl isobutyl ketone, cyclohexanone or diisobutyl ketone, etc., esters such as ethyl acetate, butyl acetate, amyl acetate, methyl formate, ethyl propionate, dimethyl phthalate or ethyl benzoate, etc., aromatic hydrocarbons such as toluene, xylene, benzene or ethylbenzene, etc., halogenated hydrocarbons such as carbon tetrachloride, trichloroethylene, chloroform, 1,1,1-trichloroethane, monochlorobenzene or chloronaphthalene, etc., ethers such as tetrahydrofuran, diethyl ether, ethylene glycol monomethyl ether or ethylene glycol monoethyl ether acetate, etc., dimethylformamide and dimethyl sulfoxide.

The photopolymerizable compositions of the present invention are particularly suitable for use as a sensitive layer on a base or an image-forming layer (non-sensitive) on the base, such as a metal layer or a coloring agent layer.

It is also possible to provide, if desired, another auxiliary layer, e.g., for improving the adhesion of the photopolymerizable composition layer to the base or the image-forming layer, and/or an antihalation layer on the surface of the base or the image-forming layer.

It is necessary that the base exhibit good light transmittance and have a smooth surface so as to facilitate the photopolymerization of the photopolymerizable composition. For example, it is desirable that the base transmits at least 30%, and preferably at least 65%, of the incident light in the wavelength range from 290 nm to 500 nm. More specifically, it is possible to use various plastic films as the base, such as films of polyethylene terephthalate, polypropylene, polyethylene, cellulose triacetate, cellulose diacetate, polyvinyl chloride, polyvinyl alcohol, polycarbonate, polystyrene, cellophane, vinylidene chloride copolymers, polyamides (for example, 6-nylon, 6,6-nylon or 6,10-nylon, etc.), polyimide, vinyl chloride-vinyl acetate copolymer, polytetrafluoroethylene, polytrifluoroethylene, etc. Further, laminate films of two or more of the foregoing plastics can be used.

Although it is possible to use bases of various thickness, generally the base thickness will be within a range from about 10 $\mu$m to 150 $\mu$m, and preferably from 15 $\mu$m to 50 $\mu$m.

The image-forming layer provided on the base desirably has a thickness of from about 20 nm to 600 nm, and preferably from about 30 nm to 100 nm, in the case of a metal base layer. In the case of a non-metal base layer (e.g.,) metal compounds, coloring agents and chalcogen glass, etc.), the thickness of the image-forming layer desirably is within a range of from about 30 nm to 20 $\mu$m, and preferably about 50 nm to 10 $\mu$m. The image-forming layer can be provided by known processes, such as a vacuum evaporation process, a chemical evaporation process, an electroplating process, a non-electrode plating process, an application process, etc.

The photopolymerizable composition layer provided on the base has a thickness such that a useful image is formed after exposure. Generally, the thickness after drying (i.e., after solvent evaporation) is in the range of from about 0.5 $\mu$m to about 100 $\mu$m, and preferably from about 1 $\mu$m to about 60 $\mu$m. When being used for a metal etching resist, the thickness of the photopolymerizable composition layer after dried is desirably in the range of from about 5 $\mu$m to about 100 $\mu$m, and preferably from about 5 $\mu$m to about 50 $\mu$m.

In using the photosensitive image-forming material of the photopolymerizable composition of the present invention, the desired areas of the photopolymerizable composition layer are exposed to light until the addition polymerization reaction in the exposed parts reaches the desired degree of polymerization, at which time the imagewise exposure is concluded. The imagewise exposure can be carried out at any suitable temperature, e.g., a temperature within the range of from about 10° to about 40° C.

Following exposure, the unexposed parts of the photopolymerizable composition layer are removed by dissolution, using a solvent (developer) which does not dissolve the polymerized (hardened) region, but rather selectively dissolves only the non-polymerized ethylenic compound, or using a solvent further comprising a component capable of dissolving the image-forming layer (referred to as a one-bath development type etching solution), by which the exposed region hardened by polymerization is left on the base or on the image-forming layer to form an image. Furthermore, the image can be obtained by stripping development as described above with respect to the prior art, by which either the exposed region hardened by polymerization or the unexposed region is left on the base or on the image-forming layer.

In the following Examples 1 to 58 and Comparison Examples 1 and 2 the present invention is illustrated in detail.

(1) Preparation of photosensitive material (A) Components forming the solution of the photopolymerizable composition used in Examples 1 to 48 and Comparison Example 1:

|  | parts by weight |
|---|---|
| Pentaerythritol tetraacrylate (ethylenic compound) | 45 |
| 3-Methyl-2-benzoylmethylene-$\beta$-naphthothiazole (photopolymerization initiator) | 2.5 |
| Benzyl methacrylate-methacrylic | 50 |

-continued

| | parts by weight |
|---|---|
| acid copolymer (ratio of repeated units: 73:27 (average) and [η]: 0.12 at 30° C. in methyl ethyl ketone solution) (binder polymer) | |
| Post-exposure polymerization inhibitor (compounds identified in Table 2) | 2.5 |
| Methyl Cellosolve (volatile solvent) | 700 |
| Methyl ethyl ketone (volatile solvent) | 500 |
| (B) Components forming the solution of the photopolymerizable composition used in Examples 49 to 58 and Comparison Example 2: | |
| Trimethylolpropane triacrylate (ethylenic compound) | 45 |
| Benzanthrone (component of two-component type photopolymerization initiator) | 1.15 |
| Michler's ketone (component of two-component type photopolymerization initiator) | 1.35 |
| Benzyl methacrylate-methacrylic acid copolymer (the same copolymer as described above in (A)) (binder copolymer) | 50 |
| Post-exposure polymerization inhibitor (compound identified in Table 3) | 2.5 |
| Methyl Cellosolve (volatile solvent) | 700 |
| Methyl ethyl ketone (volatile solvent) | 500 |

The above-described components for (A) or (B) were dissolved by stirring for 3 hours in a container. The solution obtained was applied to a layer of a polyethylene terephthalate film (100 μm thick) having thereon an Al-Fe alloy layer (Al: 98.5 mol%, Fe: 1.5 mol%) (about 70 nm thick by means of a spinner (a revolving coating machine)) and dried at 80° C. for 10 minutes to form a sensitive layer. The thickness of the sensitive layer after drying was about 3 μm.

(2) Measurement of the sensitivity of the photosensitive material and the post-exposure polymerization effect:

An optical wedge having the optical density ratio of $\sqrt{2}$, a step difference of optical density of 0.15, number of optical density steps, and a minimum optical density of 0.1 and a maximum optical density of 2.3, was placed on the sensitive layer of the photosensitive material and adhered closely thereto by reducing the pressure therebetween. After the sensitive layer was imagewise exposed to light for 15 seconds at a distance of 50 cm from the light source (2 kw mercury lamp), the layer was developed by dipping in an aqueous alkaline solution having a composition as described below at 31° C. for 40 seconds.

| Aqueous Alkaline Solution (developer) | parts by weight |
|---|---|
| Sodium hydroxide | 4 |
| Potassium hydrobromide | 10 |
| Sodium phosphate (Na₃PO₄ . 12H₂O) | 10 |
| Water | 1,000 |

Two identical materials were prepared, one of which was developed just after imagewise exposure, and the other of which was developed after the exposed material was allowed to stand in a dark room for 1 day (temperature: about 21° to 23° C.).

The sensitivity of the photosensitive material is shown by the step number of the optical wedge in the maximum optical density corresponding to the hardened image obtained by development. The sensitivity where the development was carried out just after imagewise exposure is shown as $S_0$, and the sensitivity where the post-exposure polymerization was allowed to continue for 1 day after imagewise exposure is shown as $S_{1d}$; therefore the post-exposure polymerization effect is shown as $S_{1d}-S_0$. A smaller value for $S_{1d}-S_0$ means that the post-exposure polymerization is reduced. The results are described in Tables 2 and 3.

EXAMPLES 1–48 AND COMPARISON EXAMPLE 1

Ethylenic compound: Pentaerythritol tetraacrylate.
Photopolymerization initiator: 3-Methyl-2-benzoylmethylenenaphthothiazole.

TABLE 2

| | Post-Exposure Polymerization Inhibitor Compound | $S_0$ | $S_{1d}$ | $S_{1d}-S_0$ |
|---|---|---|---|---|
| Comparison Example 1 | None | 8 | 13 | 5 |
| Example 1 | (I-1) | 7 | 10 | 3 |
| Example 2 | (I-2) | 9 | 13 | 4 |
| Example 3 | (I-3) | 7 | 10 | 3 |
| Example 4 | (I-4) | 5 | 9 | 4 |
| Example 5 | (I-5) | 7 | 10 | 3 |
| Example 6 | (I-6) | 7 | 9 | 2 |
| Example 7 | (I-7) | 7 | 10 | 3 |
| Example 8 | (I-9) | 5 | 8 | 3 |
| Example 9 | (I-10) | 8 | 12 | 4 |
| Example 10 | (I-15) | 8 | 11 | 3 |
| Example 11 | (I-17) | 6 | 8 | 2 |
| Example 12 | (I-20) | 7 | 11 | 4 |
| Example 13 | (I-21) | 6 | 8 | 2 |
| Example 14 | (I-22) | 8 | 11 | 3 |
| Example 15 | (I-23) | 7 | 10 | 3 |
| Example 16 | (I-24) | 7 | 9 | 2 |
| Example 17 | (I-25) | 7 | 10 | 3 |
| Example 18 | (I-26) | 7 | 11 | 4 |
| Example 19 | (II-1) | 7 | 11 | 4 |
| Example 20 | (II-2) | 6 | 8 | 2 |
| Example 21 | (II-3) | 6 | 8 | 2 |
| Example 22 | (II-4) | 5 | 7 | 2 |
| Example 23 | (II-5) | 5 | 7 | 2 |
| Example 24 | (II-6) | 6 | 8 | 2 |
| Example 25 | (II-7) | 6 | 8 | 2 |
| Example 26 | (II-8) | 5 | 8 | 3 |
| Example 27 | (II-9) | 5 | 7 | 2 |
| Example 28 | (II-10) | 7 | 8 | 1 |
| Example 29 | (II-18) | 7 | 10 | 3 |
| Example 30 | (II-20) | 6 | 10 | 4 |
| Example 31 | (III-1) | 5 | 8 | 3 |
| Example 32 | (III-2) | 5 | 8 | 3 |
| Example 33 | (III-3) | 7 | 9 | 2 |
| Example 34 | (III-4) | 6 | 9 | 3 |
| Example 35 | (III-5) | 5 | 8 | 3 |
| Example 36 | (III-6) | 6 | 9 | 3 |
| Example 37 | (III-7) | 5 | 8 | 3 |
| Example 38 | (III-8) | 5 | 8 | 3 |
| Example 39 | (III-9) | 6 | 9 | 3 |
| Example 40 | (III-10) | 7 | 9 | 2 |
| Example 41 | (III-11) | 5 | 8 | 3 |
| Example 42 | (III-12) | 5 | 8 | 3 |
| Example 43 | (III-14) | 5 | 7 | 2 |
| Example 44 | (III-15) | 6 | 9 | 3 |
| Example 45 | (III-16) | 5 | 8 | 3 |
| Example 46 | (III-18) | 5 | 7 | 2 |
| Example 47 | (III-19) | 5 | 8 | 3 |
| Example 48 | (III-20) | 6 | 9 | 3 |

EXAMPLES 49-58 AND COMPARISON EXAMPLE 2

Ethylenic compound: Trimethylolpropane triacrylate.
Photopolymerization initiator: Benzanthrone and Michler's ketone (molar ratio: 1:1)

TABLE 3

| | Post-Exposure Polymerization Inhibitor Compound | $S_{1d} - S_0$ |
|---|---|---|
| Comparison Example 2 | None | 3 |
| Example 49 | (I-1) | 2 |
| Example 50 | (I-2) | 1 |
| Example 51 | (I-6) | 1 |
| Example 52 | (I-15) | 1 |
| Example 53 | (II-2) | 1 |
| Example 54 | (II-5) | 1 |
| Example 55 | (II-9) | 1 |
| Example 56 | (III-3) | 2 |
| Example 57 | (III-10) | 1 |
| Example 58 | (III-16) | 2 |

It is clear from the above-described results that the post-exposure polymerization inhibitors of the present invention are effective in reducing post-exposure polymerization with no-significant reduction in the light sensitivity of the photosensitive material (i.e., the photopolymerizable compositions).

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising
   (1) an addition-polymerizable compound having at least one ethylenically unsaturated double bond,
   (2) a photopolymerizable initiator, and
   (3) a post-exposure polymerization inhibitor compound including a thioureylene group.

2. A photopolymerizable composition comprising
   (1) an addition-polymerizable compound having at least one ethylenically unsaturated double bond,
   (2) a photopolymerization initiator, and
   (3) a post-exposure polymerization inhibitor compound selected from the group consisting of thiourea and thiourea derivatives represented by the general formula (I), thiosemicarbazide and thiosemicarbazide derivatives represented by the general formula (II), and thiosemicarbazone derivatives represented by the general formula (III)

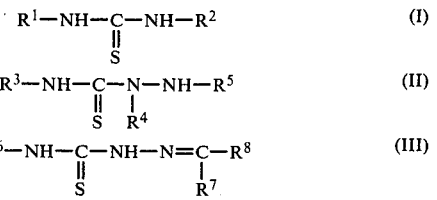

wherein:

$R^1$ and $R^2$, which may be the same or different, each represents a hydrogen atom, an alkyl group having from 1 to 6 carbon atoms, a substituted alkyl group having from 1 to 6 carbon atoms, a phenyl group, a naphthyl group, a substituted phenyl group or a monovalent group derived from an O-, S- or N-containing 5- or 6-member heterocyclic nucleus, $R^3$ represents a hydrogen atom, an alkyl group having from 1 to 6 carbon atoms, a substituted alkyl group having from 1 to 6 carbon atoms, a phenyl group, a naphthyl group or a substituted phenyl group, $R^4$ represents a hydrogen atom or an alkyl group having from 1 to 6 carbon atoms, $R^5$ represents a hydrogen atom, an alkyl group having from 1 to 6 carbon atoms, a phenyl group, a naphthyl group, a monovalent group derived from an O-, N-or S-containing 5- or 6-member heterocyclic nucleus, an alkylcarbonyl group having from 2 to 7 carbon atoms or a benzoyl group, $R^6$ represents a hydrogen atom, an alkyl group having from 1 to 6 carbon atoms, a phenyl group or a naphthyl group, $R^7$ represents a hydrogen atom or an alkyl group having from 1 to 6 carbon atoms, and $R^8$ represents an alkyl group having from 1 to 6 carbon atoms, a phenyl group, a naphthyl group or a substituted phenyl group.

3. A photopolymerizable composition as in claim 1, which additionally contains a binder comprising a high molecular weight organic substance having a film-forming capability.

4. A photopolymerizable composition as in claim 2, which additionally contains a binder comprising a high molecular weight organic substance having a film-forming capability.

5. A photopolymerizable composition as in claim 2 or 4, wherein when $R^1$, $R^2$, $R^3$, $R^4$, $R^5$, $R^6$, $R^7$ or $R^8$ represents an alkyl group having from 1 to 6 carbon atoms, the alkyl group is a methyl, ethyl, propyl, or cyclohexyl group.

6. A photopolymerizable composition as in claim 2 or 4, wherein when $R^1$, $R^2$ or $R^3$ represents a substituted alkyl group having from 1 to 6 carbon atoms, the alkyl group is substituted with a hydroxymethyl, 2-hydroxyethyl or benzyl group.

7. A photopolymerizable composition as in claim 2 or 4, wherein when $R^1$, $R^2$, $R^3$ or $R^8$ represents a substituted phenyl group, the substituted phenyl group is a p-tolyl, p-methoxyphenyl, p-aminophenyl, p-(dimethylamino)phenyl, p-cyanophenyl, p-nitrophenyl, m-nitrophenyl, o-nitrophenyl, p-hydroxyphenyl, m-hydroxyphenyl, o-hydroxyphenyl, p-chlorophenyl, m-chlorophenyl or a p-bromophenyl group.

8. A photopolymerizable composition as in claim 2 or 4, wherein when $R^1$ or $R^2$, or $R^5$ represents a monovalent group derived from an O-, S- or N-containing 5- or 6-member heterocyclic nucleus, the heterocyclic nucleus is a 2-furyl, 2-thenyl, 2-thiazolyl, 2-pyridyl or 2-pyrimidinyl group.

9. A photopolymerizable composition as in claim 2 or 4, wherein when $R^5$ represents an alkylcarbonyl group having from 2 to 7 carbon atoms, said group is an acetyl or propionyl group.

10. A photopolymerizable composition as in claim 2 or 4, wherein the inhibitor compound is a thiourea derivative selected from the group consisting of 1-ethyl-3-phenylthiourea, 1,3-diphenylthiourea, 1,3-diethylthiourea, 1-ethyl-3-p-chlorophenylthiourea, 1-ethyl-3-(2-hydroxyethyl)thiourea, 1-(2-thiazolyl)-3-phenylthiourea, 1-ethylthiourea, 1-p-bromophenyl-3-phenylthiourea, 1-(2-thiophenyl)-3-phenylthiourea, 1,3-bis(2-hydroxyethyl)thiourea, 1-p-aminophenyl-3-phenylthiourea, 1-p-nitrophenyl-3-phenylthiourea, 1-p-hydroxyphenyl-3-phenylthiourea, 1-methyl-3-p-hydroxyphenylthiourea, 1-phenylthiourea, 1-m-nitrophenylthiourea, 1-p-nitrophenylthiourea, 1-p-aminophenylthiourea, thiourea, 1,3-dimethylthiourea, 1,3-dicyclohexylthiourea, 1-phenyl-3-p-chlorophenylthiourea, 1-phenyl-3-p-methoxyphenylthiourea, 1,1-diphenylthiourea, 1,1-dibenzyl-3-phenethylthiourea and 1-phenyl-3-(2-hydroxyethyl)thiourea.

11. A photopolymerizable composition as in claim 2 or 4, wherein the inhibitor compound is a thiosemicarbazide derivative selected from the group consisting of 1-acetylthiosemicarbazide, 2-methyl-4-phenylthiosemicarbazide, 1-methyl-1,4-diphenylthiosemicarbazide, 1-(2-pyridyl)-4-ethylthiosemicarbazide, 1,4-diphenylthiosemicarbazide, 1-(2-pyridyl)-4-phenylthiosemicarbazide, 1-(2-pyridyl)-4-p-chlorophenylthiosemicarbazide, 1-(2-thienyl)-4-ethylthiosemicarbazide, 4-methylthiosemicarbazide, thiosemicarbazide, 4-(2-hydroxyethyl)thiosemicarbazide, 1-(2-thienyl)-4-phenylthiosemicarbazide, 1-p-nitrophenyl-4-phenylthiosemicarbazide, 1-m-nitrophenyl-4-phenylthiosemicarbazide, 1-p-hydroxyphenyl-4-phenylthiosemicarbazide, 1-phenyl-4-p-hydroxyphenylthiosemicarbazide, 1-p-aminophenyl-4-phenylthiosemicarbazide, 1-benzoylthiosemicarbazide, 1-acetyl-4-methylthiosemicarbazide and 1-(4-methyl-2-pyrimidinyl)-4-ethylthiosemicarbazide.

12. A photopolymerizable composition as in claim 2 or 4, wherein the inhibitor compound is a thiosemicarbazone derivative selected from the group consisting of 1-phenyl-5-p-(dimethylamino)phenylthiosemicarbazone, 1-phenyl-5-p-methoxyphenylthiosemicarbazone, 1-phenyl-5-p-hydroxyphenylthiosemicarbazone, 1-phenyl-5-m-hydroxyphenylthiosemicarbazone, 1-phenyl-5-p-tolylthiosemicarbazone, 1,5-diphenylthiosemicarbazone, 1-phenyl-5-m-chlorophenylthiosemicarbazone, 1-phenyl-5-p-bromophenylthiosemicarbazone, 1-phenyl-5-p-cyanophenylthiosemicarbazone, 1-phenyl-5-p-nitrophenylthiosemicarbazone, 1-phenyl-5-m-nitrophenylthiosemicarbazone, 1-phenyl-5-o-nitrophenylthiosemicarbazone, 1-ethyl-5-phenylthiosemicarbazone, 1-ethyl-5-o-hydroxyphenylthiosemicarbazone, 5-methyl-5-phenylthiosemicarbazone, 5,5-dimethylthiosemicarbazone, 5-p-(dimethylamino)phenylthiosemicarbazone, 1-propyl-5-phenylthiosemicarbazone, 1-propyl-5-o-hydroxyphenylthiosemicarbazone and 5-o-hydroxyphenylthiosemicarbazone.

13. A photopolymerizable composition as in claim 1, 2, 3 or 4, wherein the post-exposure polymerization inhibitor is included in the photopolymerizable composition in an amount in the range of from about 0.001% to 10% based on the weight of the addition-polymerizable compound.

14. A photopolymerizable composition as in claim 1, 2, 3 or 4, wherein the post-exposure polymerization inhibitor is included in the photopolymerizable composition in an amount in the range of from about 0.01% to 3% by weight based on the weight of the addition-polymerizable compound.

15. A photopolymerizable composition as in claim 1, 2, 3 or 4, wherein the binder is selected from the group consisting of chlorinated polyolefins, polymethyl methacrylate, polymethyl acrylate, polyvinyl chloride, polyvinylidene chloride, polyvinyl butyral, polyvinyl acetate, vinyl chloride-vinyl acetate copolymer, vinylidene chloride-acrylonitrile copolymer, polyisoprene, chlorinated rubber, polychloroprene, chlorosulfonated polyethylene, and chlorosulfonated polypropylene.

16. A photopolymerizable composition as in claim 15, wherein the binder is chlorinated polyethylene, chlorinated polypropylene, polymethyl methacrylate, or a mixture thereof.

17. A photopolymerizable composition as in claim 1, 2, 3 or 4, wherein said composition additionally contains a coloring agent.

18. A photopolymerizable composition as in claim 17, wherein said composition additionally contains a plasticizer.

19. A photosensitive element comprising a layer of a photopolymerizable composition as in claim 1, 2, 3 or 4 on a base or on an image-forming layer on a base.

20. A photosensitive element as in claim 19, wherein the base transmits at least 30% of the incident light in the wavelength range from 290 nm to 500 nm.

21. A photosensitive element as in claim 20, wherein the base transmits at least 65% of the incident light in the wavelength range from 290 nm to 500 nm.

22. A photosensitive element as in claim 19, wherein the base comprises a film of polyethylene terephthalate, polypropylene, polyethylene, cellulose triacetate, polyvinyl chloride, polyvinyl alcohol, polycarbonate, polystyrene, cellophane, vinylidene chloride copolymer, a polyamide, a polyimide, vinyl chloride-vinyl acetate copolymer, polytetrafluoroethylene, or polytrifluoroethylene, or laminate films thereof.

23. A photosensitive element as in claim 19 having a metal base layer, wherein the photosensitive layer has a thickness of from about 20 nm to 600 nm.

24. A photosensitive element as in claim 23, wherein the thickness of the photosensitive layer is from about 30 nm to 100 nm.

25. A photosensitive element as in claim 19 having a non-metal base layer wherein the photosensitive layer has a thickness of from about 30 nm to about 20 μm.

26. A photosensitive element as in claim 25, wherein the thickness of the photosensitive layer is about 50 nm to 10 μm.

* * * * *